United States Patent
Zhang

[19]

[11] Patent Number: 6,078,214
[45] Date of Patent: Jun. 20, 2000

[54] HIGH EFFICIENCY CLASS DB POWER AMPLIFIER

[75] Inventor: Zhengwei Zhang, Plano, Tex.

[73] Assignee: Texas Instruments Incorporated, Dallas, Tex.

[21] Appl. No.: 09/273,836

[22] Filed: Mar. 22, 1999

[51] Int. Cl.[7] .............................. H03F 3/38; H03F 3/00; H03F 21/00

[52] U.S. Cl. ....................... 330/10; 330/146; 330/207 A

[58] Field of Search ....................... 330/10, 146, 207 A, 330/251, 147, 69

[56] References Cited

U.S. PATENT DOCUMENTS

| | | | |
|---|---|---|---|
| 3,551,851 | 12/1970 | Engel | 330/10 |
| 4,415,862 | 11/1983 | Kunugi | 330/10 |
| 4,536,716 | 8/1985 | Yoshida et al. | 330/69 |
| 5,479,337 | 12/1995 | Voight | 330/10 |

*Primary Examiner*—Robert Pascal
*Assistant Examiner*—Patricia T. Nguyen
*Attorney, Agent, or Firm*—Ronald O. Neerings; Wade James Brady III; Frederick J. Telecky, Jr.

[57] ABSTRACT

A method and circuitry for amplifying an input signal. First, second and third input signals are provided with the third input signal being the average of the first and second input signals. A ramp signal is provided using the third input signal as the ramp base signal and the first and second signals are compared with said ramp signal to provide an output responsive to only one of the first and second signals when the ramp signal and one of the first and second signals are equivalent. A load is driven in response to the output. In addition, an error signal can be provided by comparing the output with the first and second input signals and altering the first and second input signals as a result of comparing the output with the first and second input signals. The output is a function of the value of the ramp signal when the ramp signal and one of said first and second signals are equivalent. The comparison is provided by first and second comparators and the ramp signal is provided by storing the third input signal on a capacitor and periodically applying the signal on the capacitor enhanced by a current from a current source to provide the ramp to the capacitor and then to the comparators and concurrently applying to the comparators the first and second input signals.

21 Claims, 4 Drawing Sheets

HIGH EFFICIENCY CLASS DB POWER AMPLIFIER

FIELD OF THE INVENTION

This invention relates to a high efficiency class DB power amplifier, suitable for battery-powered equipment application and especially for use in conjunction with wireless communication equipment.

BACKGROUND AND BRIEF DESCRIPTION OF THE PRIOR ART

Power consumption of portable, battery-operated electronic devices has presented a significant problem to designers of such circuits since this parameter determines the recharge frequency and available operating period as a result of a single charging of the battery. For example, in mobile battery operated telephones, the available talk time between a battery charging is one of the most competitive marketing factors. The industry is therefore constantly attempting to minimize power consumption in the battery-operated telephonic device.

In portable battery-operated systems which use amplifiers to drive acoustic output devices, such as, for example, an earphone or speaker, a significant amount of power is required to drive such acoustic output devices. This power is consumed by the amplifiers which generally operate in typical class AB wherein the power efficiency is Voutput/VDD (assuming no quiescent power consumption). On the other hand, while class D amplifiers have a one hundred percent power efficiency (assuming an ideal switch) for the single-ended signal input, class D amplifiers also require the use of an inductor as a filter to limit the high frequency current in the system. The radiation from the inductor has been found to provide RF interference with the operation of portable battery operated wireless communication equipment and therefore cannot be used in conjunction with such systems. On the other hand, for a differential system, if the inductor is eliminated from the class D amplifier, the class D amplifier efficiency becomes about $(Voutput/VDD)^2$ which is generally less than class AB amplifier efficiency. Accordingly, a class D amplifier is not a viable alternative to the class AB amplifier in such systems.

A typical output stage of a class D amplifier is shown in FIG. 1 showing PMOS transistors 1 and 5 with input terminals A and C respectively and NMOS transistors 3 and 7 with input terminals B and D respectively. The pulse-width modulated signal is applied to each of the input terminals A, B, C and D. The junctions 9 and 11 of transistors are coupled together by a pair of filters, each filter containing an inductor 13, 15 and a capacitor 17, 19 with a load resistor 21 coupled between the filters. The output is taken from each of the junctions 9 and 11. When the input is positive, transistors 1 and 3 conduct longer and when the input is negative, transistors 5 and 7 conduct longer. When the differential is zero, both transistor pairs conduct with equal amount of time within a clock cycle. Therefore, the inductors 13 and 15 are required for filtering to avoid overdriving the load at high frequency.

SUMMARY OF THE INVENTION

In accordance with the present invention, the above described problems of the prior art are minimized and there is provided an amplifier for use in conjunction with portable battery-operated electronic equipment, primarily but not limited to use in conjunction with sound reproductive equipment, which provides much higher efficiency than can presently be obtained from the prior art class AB amplifiers.

Briefly, the is provided a class DB power amplifier which requires no inductors for filtering, yet maintains about a one hundred percent efficiency for all signal levels. This is accomplished by providing a pulse-width modulation scheme that allows only transistors 1 and 3 to turn on when the input is positive, and allows transistors 5 and 7 to turn on if the input is negative. First, second and third input signals are provided with the third input signal being the average of the first and second input signals. A ramp signal is provided using the third input signal as the ramp base signal and the first and second signals are compared with said ramp signal to provide an output responsive to only one of the first and second signals when the ramp signal and one of the first and second signals are equivalent. A load is driven in response to the output. In addition, an error signal can be provided by comparing the output with the first and second input signals and altering the first and second input signals as a result of comparing the output with the first and second input signals. The output is a function of the value of the ramp signal when the ramp signal and one of said first and second signals are equivalent. The comparison is provided by first and second comparators and the ramp signal is provided by connecting the third input signal on one terminal of a capacitor and periodically applying the signal on another terminal of the capacitor enhanced by a current from a current source to provide the ramp to the capacitor and then to the comparators and concurrently applying to the comparators the first and second input signals.

DESCRIPTION OF THE PREFERRED EMBODIMENTS

Figure 2:
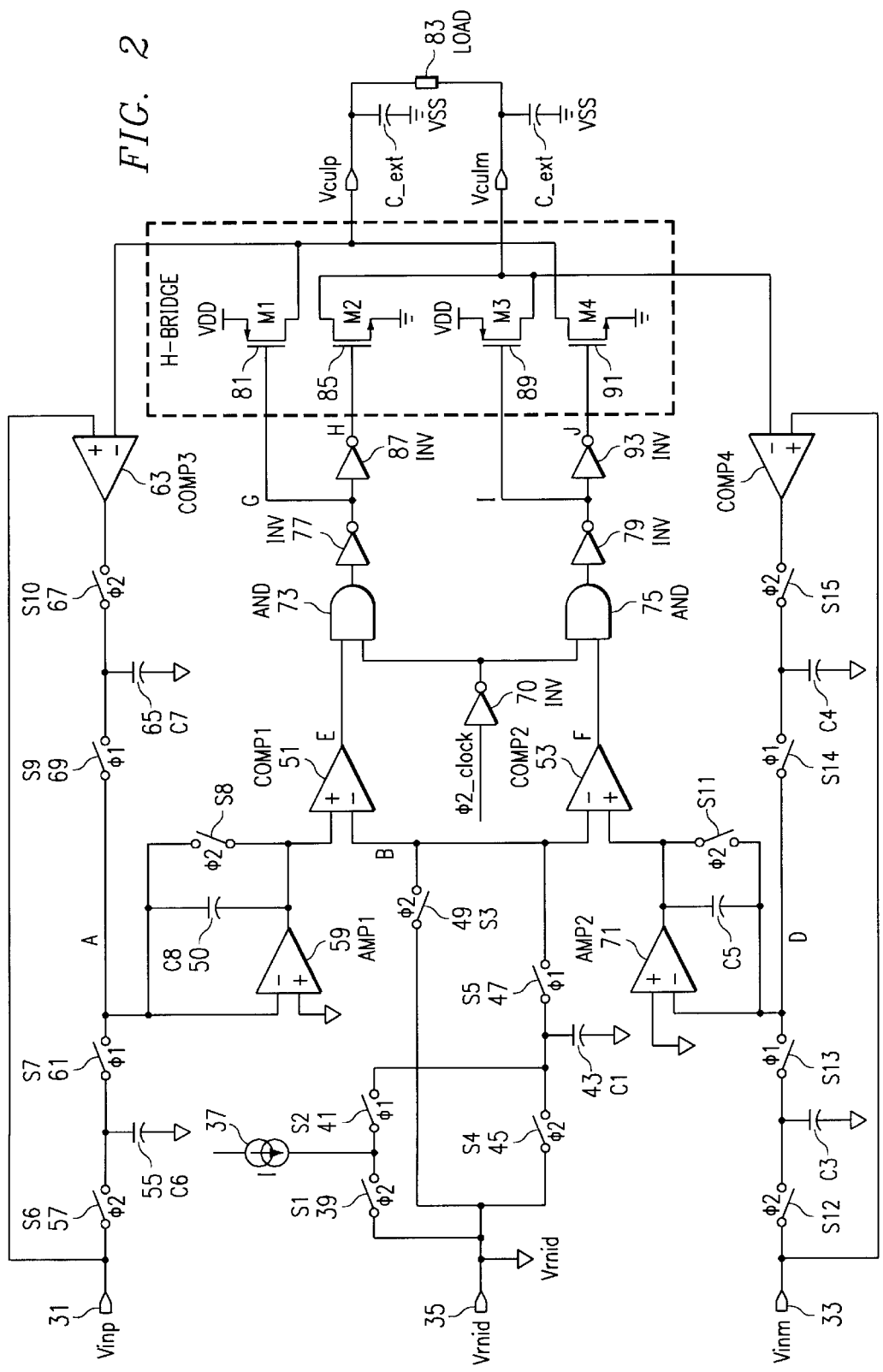
FIG. 2 is a circuit diagram of an amplifier in accordance with the present invention.

Referring to FIG. 2, there is shown a preferred embodiment in accordance with the present invention. A differential input voltage is applied to amplifier inputs 31 and 33, the voltage applied to input 33 being the complement of the voltage applied to input 31 with a voltage equal to the average of the voltages applied to inputs 31 and 33 being applied to input 35.

A ramp or saw-tooth-wave generator is provided which includes a current source 37 coupled to a phase 1 operated switch 39 and a phase 2 operated switch 41, the latter coupled to input terminal 35. A capacitor 43 is coupled to the input terminal 35 via a phase 2 operated switch 45 and to current source 37 via switch 41. The input terminal 35 is connected to the negative input terminals of a pair of comparators 51 and 53 via a phase 2 switch 47 and capacitor 43 is connected to the same negative input terminals of comparators 51 and 53 via a phase 1 switch 49 to provide the ramp signal to the comparators. During phase 1, the current source 37 pulls up the voltage at the negative inputs to comparators 51 and 53 (node B) linearly from average voltage at input terminal 35 by charging capacitor 43. During phase 2, the voltage of node B is reset to the average voltage at input terminal 35 and capacitor 43 is totally discharged by short circuiting to input terminal 35. The value of current from current source 37 and the value of capacitor 43 should be chosen so that the maximum voltage at node B will be slightly higher than the peak value of the of the input signal to input terminal 31. During phase 2, the current source 37 is connected to input terminal 35 to avoid abrupt voltage jumps at node B at the beginning of phase 1.

Comparator 51 compares the ramp voltage input thereto with the modified voltage (to be explained hereinbelow) at input 31 and comparator 53 compares the ramp voltage input thereto with the modified voltage at input 33. The input voltage at input terminal 31 is stored by capacitor 55 via phase 2 switch 57 during phase 2 (to be explained hereinbelow) and transmitted to the comparator 51 via amplifier 59 via phase 1 switch 61 during phase 1 (to be explained hereinbelow). The input voltage an input terminal 31 is also fed to a comparator 63 which compares this voltage with an output voltage (to be explained hereinbelow) and stores the error voltage by charging capacitor 65 through phase 2 switch 67 during phase 2 and discharging capacitor 65 to the input of amplifier 59 through phase 1 switch 69 during phase 1. Amplifier 71 and the circuitry coupled thereto is identical to and operates in an identical manner to the circuitry coupled to amplifier 59 and therefore requires no further discussion. Comparator 51 will generate a logic "high" state when the input voltage thereto from amplifier 59 is greater than the ramp voltage applied to the negative input thereof and comparator 53 will generate a logic "high" state when the input voltage thereto from amplifier 71 is greater than the ramp voltage applied to the negative input thereof. It can be seen that either comparator 51 or comparator 53 will be on within any given clock cycle, thereby providing class DB efficiency.

The outputs of comparators 51 and 53 and fed to one of AND gates 73 and 75 respectively which are enable when a positive input is received from the associated comparator and not during phase 2 in view of the second input to each of the AND gate via inverter 70. The outputs of and gates 73 and 75 are inverted by inverters 77 and 79 respectively, inverter 77 controlling a transistor 81 coupled to one end of a load 83 and controlling a second transistor 85 coupled to the other side of the load 83 through an inverter 87 and inverter 79 controlling a transistor 89 coupled to the other end of the load 83 and controlling a fourth transistor 91 through an inverter 93 controlling transistor 91 coupled to the first side of the load 83.

Referring to comparator 63, the amplifier output provided to the load is coupled to the negative terminal thereof. Accordingly, when the output voltage is different from the voltage of the input terminal 31, an error signal is provided by comparator 63 which alters the input voltage from terminal 31 by altering the charge stored on capacitor 65 which is then added to the charge on capacitor 55 during phase 1. This causes the output voltage to always track and be equal to the input voltage.

Figure 1A:
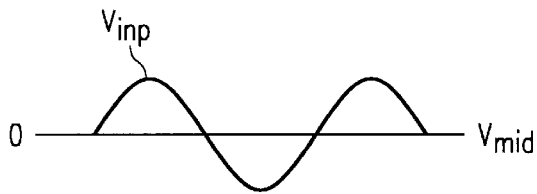
FIG. 1 is a circuit diagram of a typical output stage of a prior art class D amplifier.
Figure 1B:
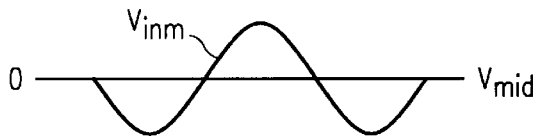
Figure 1C:
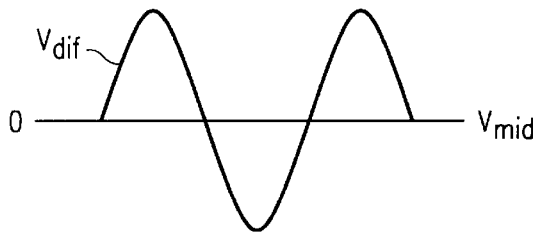
Figure 1D:
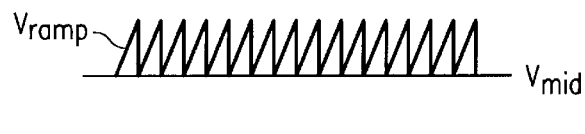
Figure 1E:
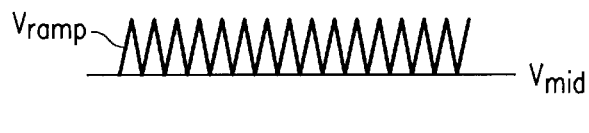
Figure 1F:
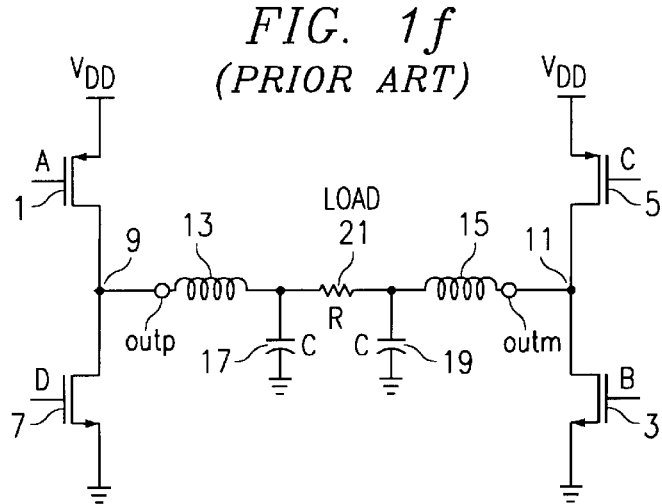
Figure 3:
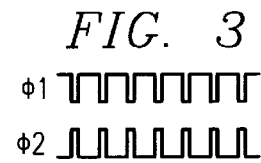
FIG. 3 is a timing diagram showing operation of the phase 1 and phase 2 switches of FIG. 2.

Referring to FIG. 3, there is shown a timing diagram for operation of the phase 1 and phase 2 switches of FIG. 2. As can be seen, when the phase 1 switches are closed (higher voltage), the phase 2 switches are open (lower voltage) and vice versa.

In operation, when phase 2 is high as shown in FIG. 3, the switches 57 and 67 are closed, thereby allowing capacitors 55 and 65 to charge up with the same operation taking place in the portion of the circuit coupled to input terminal 33. Also, switches 39, 45 and 49 will close, to apply the voltage at input terminal 35 and current from current source 37 to capacitor 43. When phase 2 now goes low and phase 1 goes high, the phase 2 switches open and switches 41 and 47 close, thereby continually adding a charge to the charge already across capacitor 43 and applying this charge in the form of a voltage to the negative inputs of comparators 51 and 53. Concurrently, switches 57 and 67 open and switches 61 and 69 close, thereby providing to amplifiers 59 and corresponding amplifier 71 a voltage corresponding to the sum of the charge stored on capacitors 55 and 65. which in turn is fed to the positive input of comparator 51 or 53. The outputs of comparators 51 and 53 will remain "high" until the ramp voltage is higher than the voltage on the positive terminal of one of the comparators, therefore, the input signal is pulse-width modulated which drives the respective inverters and transistors coupled thereto to energize the load 83 with the feedback voltage being applied back to the comparator 63 as discussed above. During phase 2, AND gates 73 and 75 are disabled and all of the switches in the H-bridge (81, 85, 89, 91) are therefore off.

It should be noted that not only is there a power saving in the ability to provide essentially class D operation without the use of an inductor, but further, when there is no input differential voltage at input terminals 31 and 33, the amplifier will be off, thereby further limiting the power requirements as compared with prior art amplifiers which will be on at least part of the time.

Figure 4:
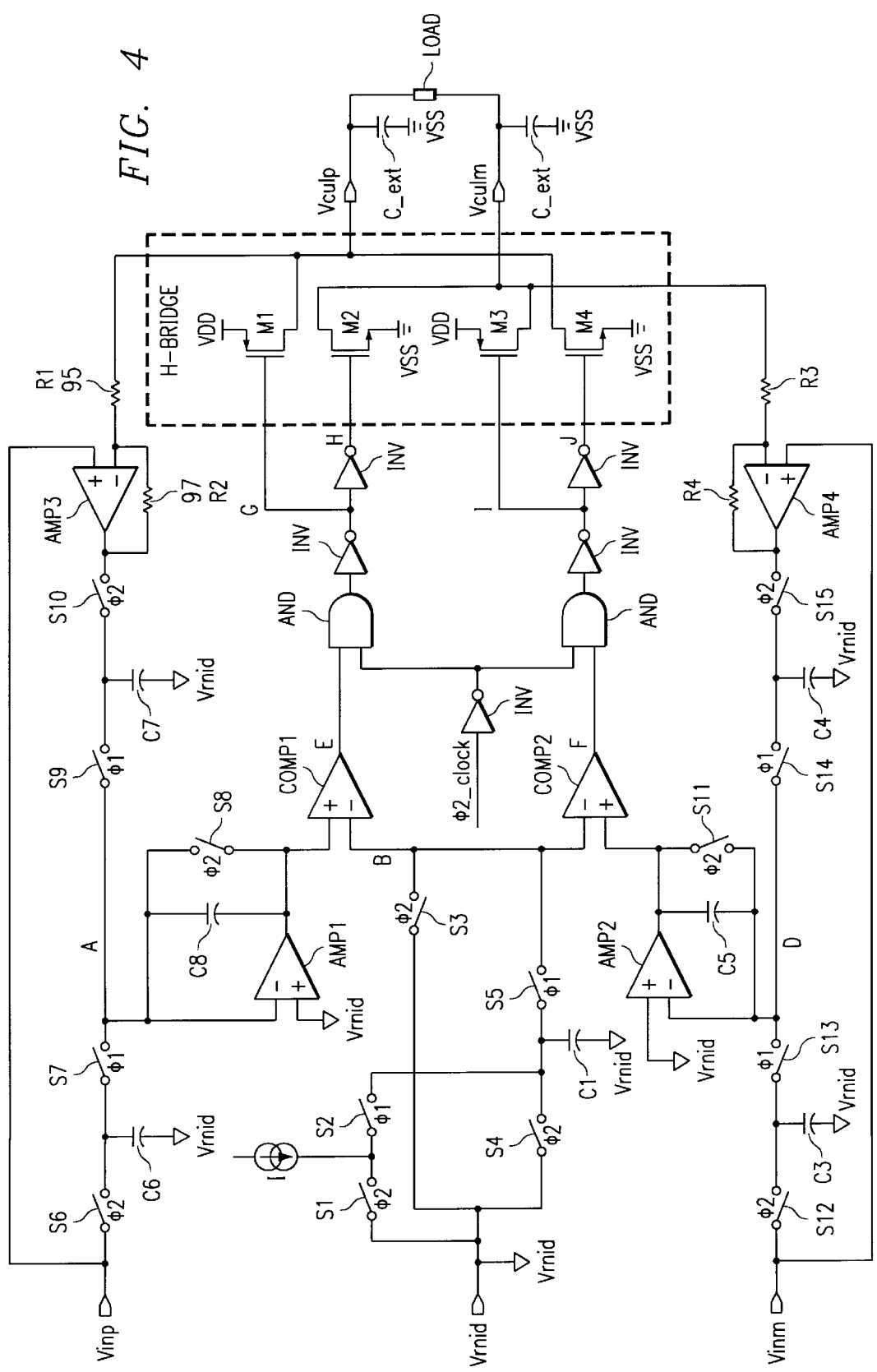
FIG. 4 is a circuit diagram of an amplifier in accordance with a second embodiment of the present invention.

Referring to FIG. 4, there is shown a circuit which is identical to that of FIG. 3 except for the structure at comparator 63 wherein a resistor 95 is in series with the input to the negative comparator terminal and a resistor 97 is in parallel with comparator 63. The feedback network in FIG. 3 can only make the output approach the input but never equal the input. This is because when the output is equal to the input, the output of comparator 63 is unknown (either low or high). Therefore the output will deviate away from the input at the next clock cycle. With resistors 95 and 97, the output of comparator 63 is $V_{inp} - (R_2/R_1)(V_{outp} - V_{inp})$. When $V_{outp} = V_{inp}$, there is no unknown state for comparator 63 and the feedback will not change the input level seen by comparator 51 as if both capacitors 55 and 65 are connected together as a larger capacitor.

Figure 6:
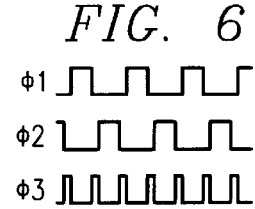
FIG. 6 is a 3-phase timing diagram used in conjunction with the embodiment of FIG. 5.
Figure 5:
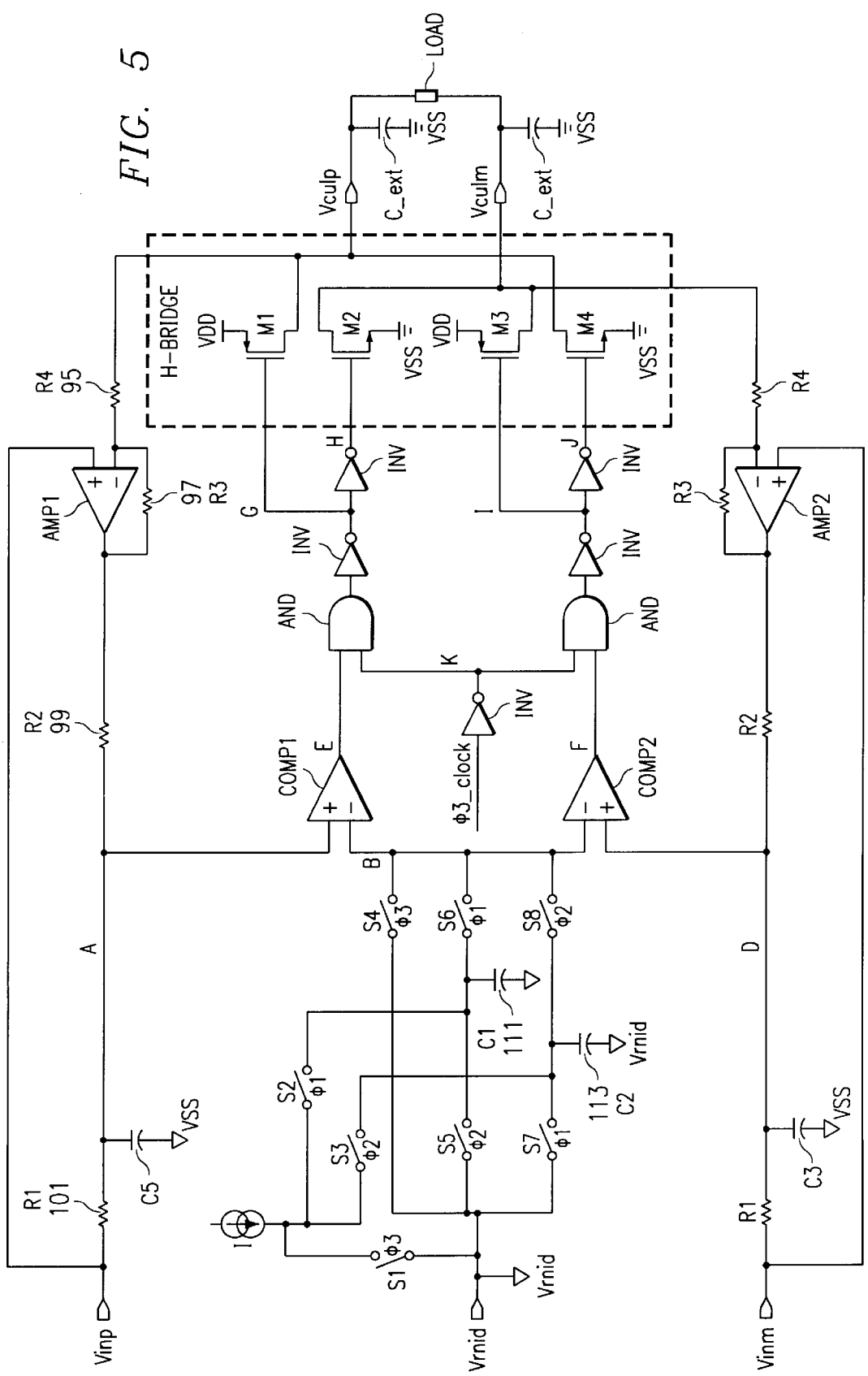
FIG. 5 is a circuit diagram of an amplifier in accordance with a third embodiment of the present invention.

Referring to FIG. 5, there is shown a third embodiment of the invention which includes 3-phase timing as shown in FIG. 6 which contains the added resistors 95 and 97 discussed above with reference to FIG. 4. In this embodiment, the amplifier 59 of FIG. 2 has been deleted, the switches 67 and 69 and capacitor 65 have been replaced by a resistor 99, switch 61 has been deleted and resistor 101 has replaced switch 57. In addition, the sawtooth wave generator which provides the input to the negative terminals of comparators 51 and 53 has been changed. FIG. 5 is a continuous-time version of a class DB amplifier which saves two operational amplifiers used in the sample-and-hold stage of the switched capacitor version of FIGS. 2 and 4. The voltage at the positive input of comparator 51, $V_A = V_{inp} - (1+(R_2/(R_1+R_2)))(R_3/R_4)(V_{outp} - V_{inp})$ which conforms a negative feedback system. When $V_{outp} = V_{inp}$, then $V_A = V_{inp}$ and the feedback network will not disturb the system. If $V_{outp} > V_{inp}$, then $V_A$ is less than $V_{inp}$, therefore the pulse duration at the output of comparator 51 will be shortened and $V_{outp}$ drops back to $V_{inp}$. For the case when $V_{outp} < V_{inp}$, the feedback will make the pulse duration longer, so $V_{outp}$ will be increased.

In FIG. 5, the voltage ramp circuit is also improved by using a 3-phase clock compare to the two phase clock of FIGS. 2 and 4. Phase 3 plays the same important role as does phase 2 of the prior embodiments, however the pulse width of the phase 3 pulse can be much shorter than the phase 2 pulse of the prior embodiments because the duration of phase 2 depends upon how fast the sample-and-hold stage can discharge capacitor 50 and how fast the $V_{mid}$ buffer (not shown) can discharge capacitor 43. In FIG. 5, two sets of voltage ramping are alternatively used. The discharge of capacitor 111 or capacitor 113 is accomplished with normal clock durations of phase 1 or phase 2, therefore, phase 3 durations can be very short (~3 ns), which increases the output swing which the system can deliver to the load 83. Note that in all of the embodiments, the load value has been set at 16 to 32 ohms which is the typical load value for a wireless telephone handset. For other applications, the load can be of different value as well as the decoupling capacitors.

Though the invention has been described with reference to a specific preferred embodiment thereof, many variations and modification will immediately become apparent to those skilled in the art. It is therefore the intention that the appended claims be interpreted as broadly as possible in view of the prior art to include all such variations and modifications.

I claim:

1. A method of amplifying an input signal which comprises the steps of:
   (a) providing first, second and third input signals, said third input signal being the average of said first and second input signals;
   (b) providing a ramp signal using said third input signal as the ramp base signal;
   (c) comparing said first and second signals with said ramp signal and providing an output responsive to only one of said first and second signals when said ramp signal and one of said first and second signals are equivalent; and
   (d) driving a load in response to said output.

2. The method of claim 1 further including the steps of comparing said output with said first and second input signals and altering said first and second input signals as a result of said comparing said output with said first and second input signals.

3. The method of claim 1 wherein said ramp is a positive-going ramp.

4. The method of claim 2 wherein said ramp is a positive-going ramp.

5. The method of claim 1 wherein said output is a function of the value of said ramp signal when said ramp signal and said one of said first and second signals are equivalent.

6. The method of claim 2 wherein said output is a function of the value of said ramp signal when said ramp signal and said one of said first and second signals are equivalent.

7. The method of claim 3 wherein said output is a function of the value of said ramp signal when said ramp signal and said one of said first and second signals are equivalent.

8. The method of claim 4 wherein said output is a function of the value of said ramp signal when said ramp signal and said one of said first and second signals are equivalent.

9. The method of claim 1 further including providing first and second comparators, providing said ramp signal by storing said third input signal on a capacitor and periodically applying said signal on said capacitor enhanced by a current from a current source to said capacitor and then to said comparators and concurrently applying to said comparators said first and second input signals.

10. The method of claim 8 further including providing first and second comparators, providing said ramp signal by storing said third input signal on a capacitor and periodically applying said signal on said capacitor enhanced by a current from a current source to said capacitor and then to said comparators and concurrently applying to said comparators said first and second input signals.

11. An amplifier circuit which comprises:
    (a) first, second and third input terminals, and means to provide said third input terminal with a voltage equal to the average of the voltage applied to said first and second input terminals;
    (b) means to provide a ramp signal us id using said third input signal as the ramp base signal;
    (c) comparator circuitry for comparing said first and second signals with said ramp signal and providing an output responsive to only one of said first and second signals when said ramp signal and one of said first and second signals are equivalent; and
    (d) circuitry for driving a load in response to said output.

12. The amplifier of claim 11 further including the steps of comparing said output with said first and second input signals and altering said first and second input signals as a result of said comparing said output with said first and second input signals.

13. The amplifier of claim 11 wherein said ramp is a positive-going ramp.

14. The amplifier of claim 12 wherein said ramp is a positive-going ramp.

15. The amplifier of claim 11 wherein said output is a function of the value of said ramp signal when said ramp signal and said one of said first and second signals are equivalent.

16. The amplifier of claim 12 wherein said output is a function of the value of said ramp signal when said ramp signal and said one of said first and second signals are equivalent.

17. The amplifier of claim 13 wherein said output is a function of the value of said ramp signal when said ramp signal and said one of said first and second signals are equivalent.

18. The amplifier of claim 14 wherein said output is a function of the value of said ramp signal when said ramp signal and said one of said first and second signals are equivalent.

19. The amplifier of claim 11 further including first and second comparators, a capacitor storing said third input signal to provide said ramp signal and circuitry for periodically applying said signal on said capacitor enhanced by a current from a current source to said capacitor and then to said comparators and concurrently applying to said comparators said first and second input signals.

20. The amplifier of claim 18 further including first and second comparators, a capacitor storing said third input signal to provide said ramp signal and circuitry for periodically applying said signal on said capacitor enhanced by a current from a current source to said capacitor and then to said comparators and concurrently applying to said comparators said first and second input signals.

21. A method of amplifying an input signal which comprises the steps of:
    (a) providing first, second and third input terminals;
    (b) applying an input signal to said first and second input terminals and providing said third input terminal with an input signal equal to the average of the input signals applied to said first and second input terminals;

(c) generating a ramp voltage using said average as a base;

(d) comparing said ramp voltage with a voltage related to said input signal applied to said first input terminal and providing an output signal of a first type when said ramp voltage is lower than said input signal and providing an output signal of a second type when said ramp voltage is higher than said input signal;

(e) comparing said ramp voltage with a voltage related to said input signal applied to said second input terminal and providing an output signal of a first type when said ramp voltage is lower than said input signal and providing an output signal of a second type when said ramp voltage is higher than said input signal;

(e) utilizing the output signal of said first type to energize a load.

* * * * *